United States Patent
Kurumisawa

(10) Patent No.: US 6,781,815 B2
(45) Date of Patent: Aug. 24, 2004

(54) CAPACITOR SHEET, ELECTRO-OPTICAL DEVICE WITH CAPACITOR, FLEXIBLE SUBSTRATE, COMPOSITE BUILD-UP SUBSTRATE, AND ELECTRONIC APPARATUS

(75) Inventor: Takashi Kurumisawa, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 181 days.

(21) Appl. No.: 10/170,634

(22) Filed: Jun. 14, 2002

(65) Prior Publication Data

US 2003/0016508 A1 Jan. 23, 2003

(30) Foreign Application Priority Data

Jun. 21, 2001 (JP) .................................. 2001-188176

(51) Int. Cl.[7] .............................................. H01G 4/35
(52) U.S. Cl. ..................... 361/302; 361/303; 361/305; 361/306.3; 361/321.4; 361/321.1
(58) Field of Search ................................ 361/302, 303, 361/305, 306.1, 306.3, 321.1, 321.5, 301.4, 311, 313, 328, 330, 763, 749, 329; 257/72, 59, 71

(56) References Cited

U.S. PATENT DOCUMENTS 5,378,662 A * 1/1995 Tsuyuki ....................... 501/17
5,562,498 A * 10/1996 Brandenburg et al. ...... 439/620
6,320,204 B1 * 11/2001 Hirabayashi et al. ......... 257/71

* cited by examiner

Primary Examiner—Anthony Dinkins
Assistant Examiner—Nguyen T. Ha
(74) Attorney, Agent, or Firm—Oliff & Berridge, PLC

(57) ABSTRACT

The invention stably mounts an external capacitor in an electro-optical device. A film capacitor sheet is attached to an electro-optical device so as to cover the entire reverse side of an element substrate excluding a display region. On the film capacitor sheet, a plurality of film capacitors are formed in each region. Each film capacitor is formed by alternately stacking a plurality of conductor plates and a plurality of dielectric films and by making lead wires protrude. The dielectric films are manufactured by mixing barium titanate powder with a flexible material and by forming the mixture into the shape of a film.

13 Claims, 5 Drawing Sheets

Fig. 2(a)
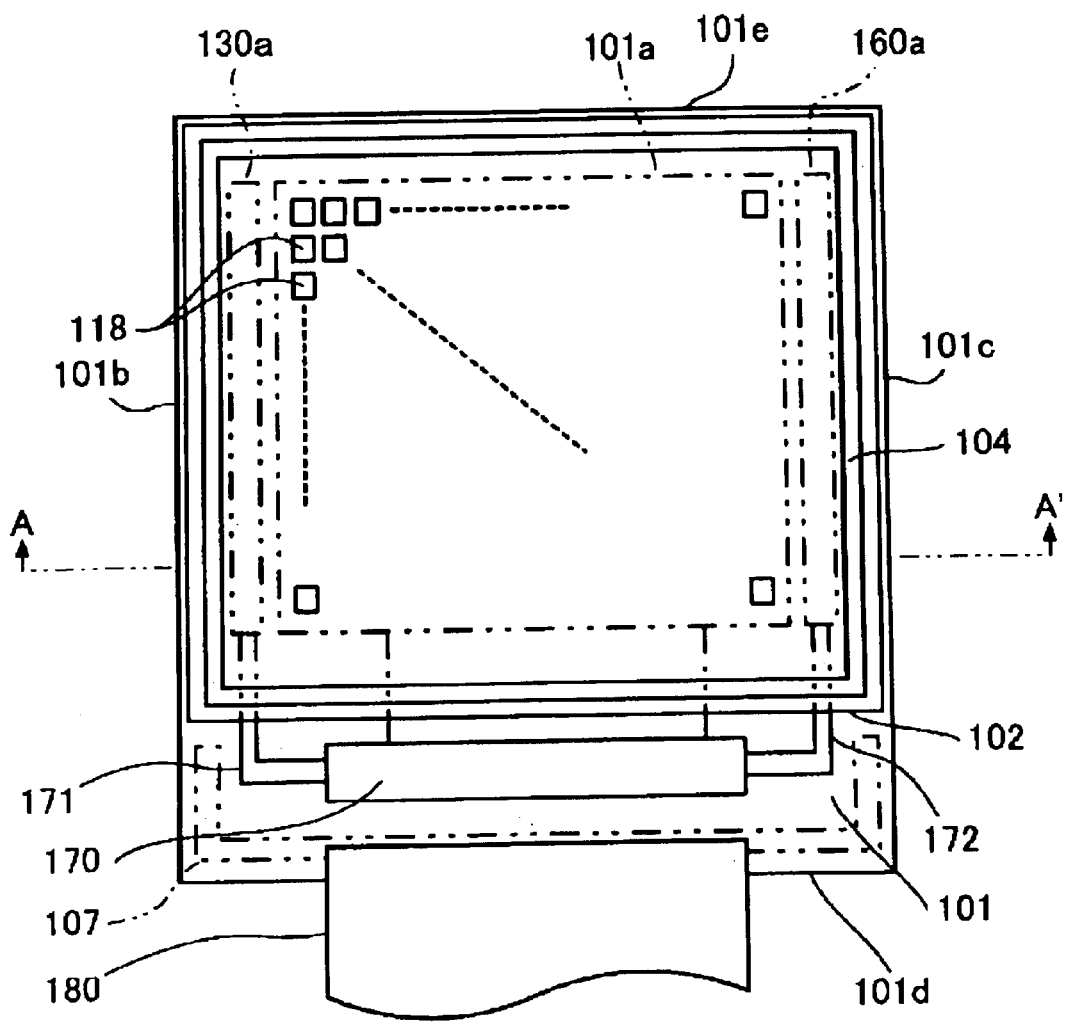
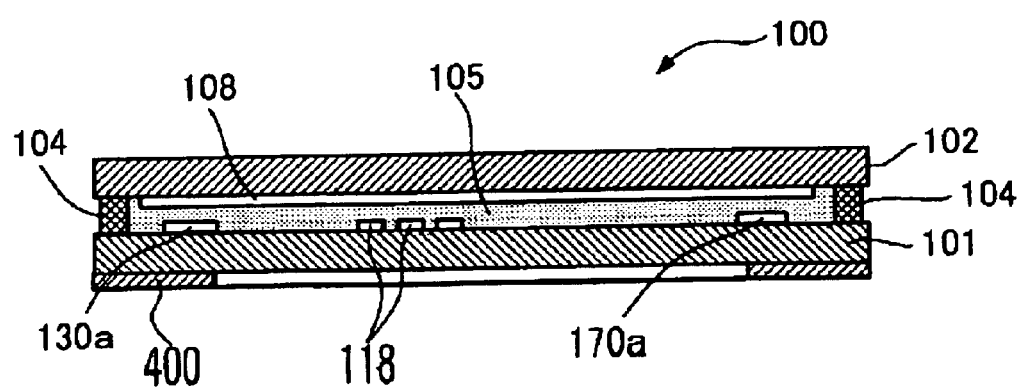
Fig. 2(b)

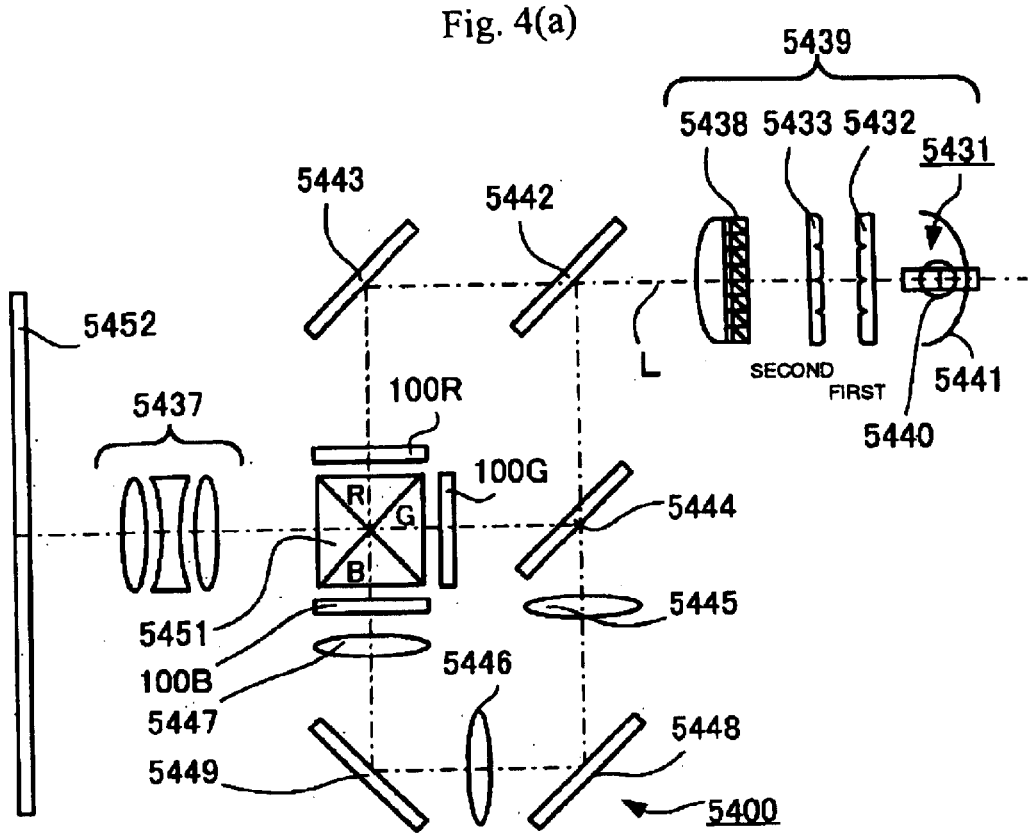
Fig. 4(a)
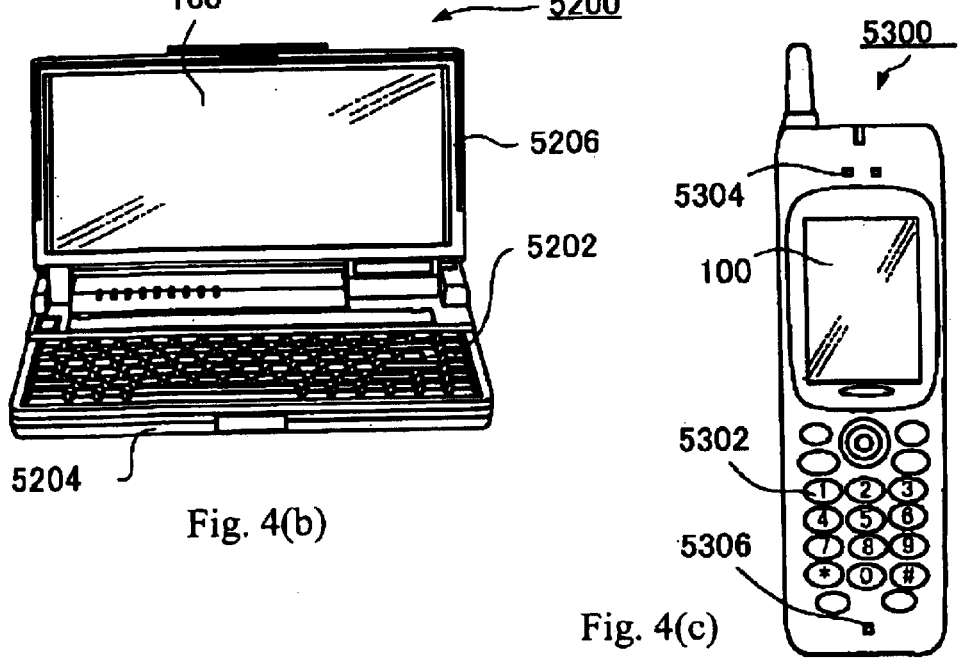
Fig. 4(b)
Fig. 4(c)

Fig. 5(a)
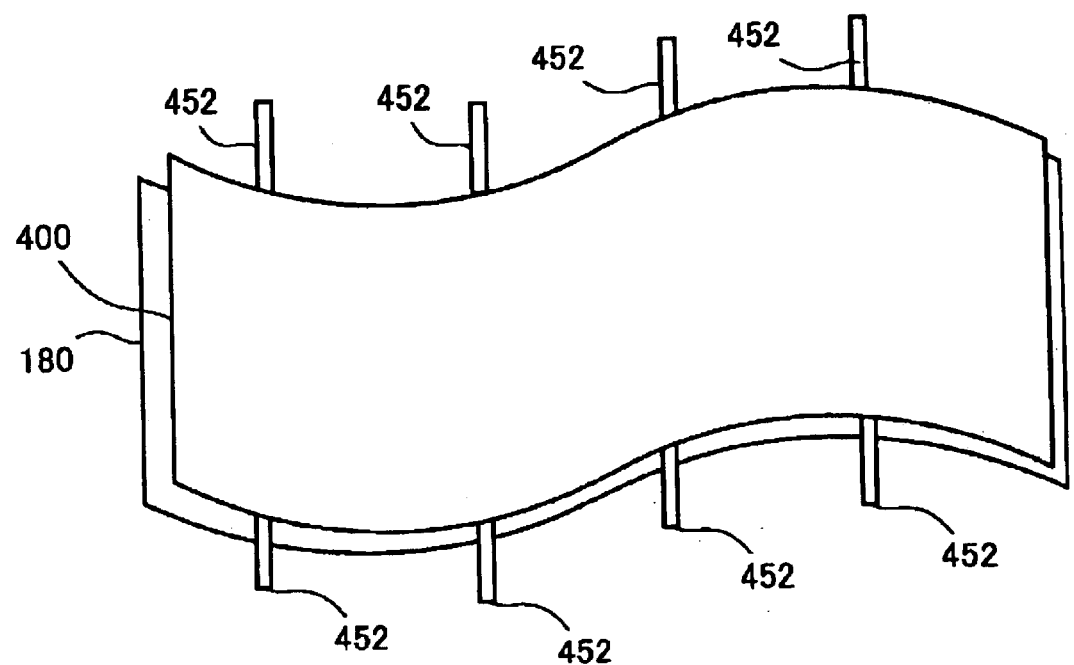
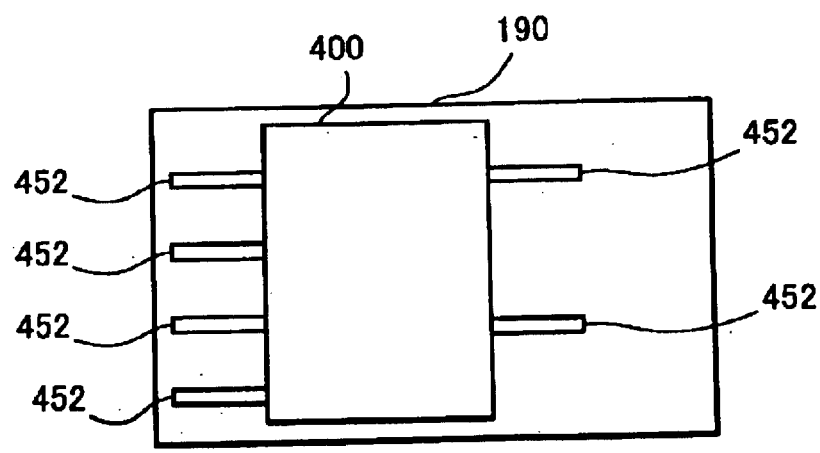
Fig. 5(b)

CAPACITOR SHEET, ELECTRO-OPTICAL DEVICE WITH CAPACITOR, FLEXIBLE SUBSTRATE, COMPOSITE BUILD-UP SUBSTRATE, AND ELECTRONIC APPARATUS

BACKGROUND OF THE INVENTION

1. Field of Invention

The present invention relates to capacitor sheets suitable for use in electro-optical devices and other various electronic apparatuses, electro-optical devices with capacitors, flexible substrates, composite build-up substrates, and electronic apparatuses.

2. Description of Related Art

Electro-optical devices, such as liquid crystal panels using liquid crystal as an electro-optical material, are widely used as display devices in place of cathode-ray tubes (CRT) in displays of various information processing apparatuses and liquid crystal televisions. For example, a related art electro-optical device has the following arrangement. Specifically, the related electro-optical device includes an element substrate having pixel electrodes aligned in the form of a matrix and switching elements such as TFTs (Thin Film Transistors) connected to the pixel electrodes, an opposing substrate having a counter electrode opposed to the pixel electrodes, and liquid crystal, i.e., electro-optical material, filled between the two substrates.

With this arrangement, when a scanning signal is supplied to the switching element via a scanning line, the switching element becomes conducting. In this conducting state, when an image signal with a voltage in accordance with a gray level is supplied to the pixel electrode through a data line, a charge in accordance with the voltage of the image signal is accumulated in a liquid crystal layer between the pixel electrode and the counter electrode. When the switching element is turned off after the charge has been accumulated, the accumulated charge in the liquid crystal layer is maintained by the capacitance between the pixel electrode and the counter electrode and by a storage capacitance. Accordingly, when the switching elements are driven so as to control the amount of charge to be accumulated in accordance with the gray level, light is modulated according to each pixel, and the display gray level varies, thus performing gray-scale display.

It is only necessary to accumulate charge in an electrode of each pixel for a partial period of a period for which one screen is displayed. First, a scanning-line drive circuit sequentially selects each scanning line. Second, a data-line drive circuit sequentially selects each data line within the scanning-line selection period. Third, an image signal with a voltage in accordance with a gray level is sampled on the selected data line. As a result, time-division multiplexing driving, in which the scanning line and the data line are shared by a plurality of pixels, is made possible.

Liquid crystal panels have a structure formed by bonding together, with a predetermined gap therebetween, an element substrate having pixel electrodes and an opposing substrate having a counter electrode. The element substrate and the opposing substrate holding therebetween liquid crystal as an electro-optical material. The element substrate and the opposing substrate are amorphous substrates formed of glass or quartz. Recently, technology has been developed for mounting an integrated circuit having a drive circuit on the element substrate by COG (chip on glass) or TAB (Tape Automated Bonding) and for integrally forming the liquid crystal panel and the drive circuit. The integrated circuit is formed by forming the drive circuit on a chip, which is largely formed of single-crystal silicon, and by sealing the chip with resin. A pattern for inputting an image signal from an external device is formed on the element substrate. A flexible tape wire is connected to the pattern.

SUMMARY OF THE INVENTION

The drive circuit of the liquid crystal panel requires a capacitor to smooth a power supply voltage and to boost voltage using a charge pumping system. A problem exists with regard to the manner in which the capacitor is mounted. For example, the capacitor can be formed in the interior of a semiconductor chip in the integrated circuit. Since the capacitor occupies a relatively large area of the interior of the integrated circuit, the semiconductor chip increases in size, and hence the semiconductor chip becomes expensive.

With regard to technology to externally attach the capacitor, the capacitor may be formed by a ceramic-type chip capacitor, and the capacitor may be mounted on a flexible tape wire. The flexible tape wire is flexible, whereas the chip capacitor is rigid. Thus, metal fatigue occurs in a joint portion between the flexible tape wire and the chip capacitor. It thus becomes easier for the chip capacitor to fall off the flexible tape wire. Alternatively, the chip capacitor can be mounted on the element substrate.

The chip capacitor is thicker than the integrated circuit, and it is difficult to mount the chip capacitor on the element substrate formed of glass or quartz. When the chip capacitor is forcedly mounted on the element substrate, the chip capacitor easily falls off because of vibrations and because of differences in the thermal spreading coefficient.

In view of the foregoing circumstances, the present invention to provides a capacitor sheet which is inexpensive and which can be mounted stably, an electro-optical device with a capacitor, a flexible substrate, a composite build-up substrate, and an electronic apparatus. The present invention also enhances a light-blocking effect in a non-display region of the electro-optical device.

Exemplary embodiments are discussed below, which address the above problems.

A capacitor sheet in accordance with a first aspect forms a capacitor having a single-layer structure or a multi-layer structure. The capacitor includes a dielectric layer (dielectric film) which is a flexible sheet formed by mixing dielectric material (barium titanate, etc.) powder with a polymeric material polyethylene, resist, etc.) and conductor layers (conductor plates) which are flexible and which are formed so as to hold the dielectric layer therebetween.

An electro-optical device with a capacitor in accordance with a second aspect includes the electro-optical device including a plurality of scanning lines, a plurality of data lines, and pixels (pixel electrodes) arranged in correspondence with intersections of the scanning lines and the data lines and a capacitor sheet as set forth in the first aspect, which is fixed to the electro-optical device.

An electro-optical device in accordance with a third aspect includes the electro-optical device with the capacitor as set forth in the second aspect, and further includes a display region to display information when being irradiated with external irradiation light. The capacitor sheet is mounted along the periphery of the display region, whereby a portion in which the capacitor sheet is mounted is shielded from the irradiation light.

An electro-optical device in accordance with a fourth aspect includes the electro-optical device with the capacitor as set forth the second aspect, such that the capacitor sheet has shock resistance.

A capacitor sheet in accordance with a fifth aspect includes the capacitor sheet as set forth in the first aspect, where the capacitor sheet is formed by a plurality of capacitors formed in each region on a surface of the sheet.

A flexible substrate in accordance with a sixth aspect includes a capacitor sheet as set forth in the first aspect, such that the capacitor sheet is mounted on a top surface of the flexible substrate or is included as a layer in the flexible substrate.

A composite build-up substrate in accordance with a seventh aspect includes a capacitor sheet as set forth in the first aspect, such that the capacitor sheet is mounted on a top surface of the composite build-up substrate or is included as a layer in the composite build-up substrate.

An electronic apparatus in accordance with an eighth aspect includes a capacitor sheet as set forth in the first aspect.

BRIEF DESCRIPTION OF THE DRAWINGS

FIGS. 2(a) and 2(b) include diagrams showing the structure of the electro-optical device in this embodiment.

FIGS. 4(a)–4(c) include illustrations showing examples of various electronic apparatuses to which the electro-optical device is applied.

FIGS. 5(a) and 5(b) include illustrations showing modifications of the film capacitor sheet 400.

DETAILED DESCRIPTION OF PREFERRED EMBODIMENTS

1. Structure of the Embodiments 1.1 Overall Structure

Figure 1:
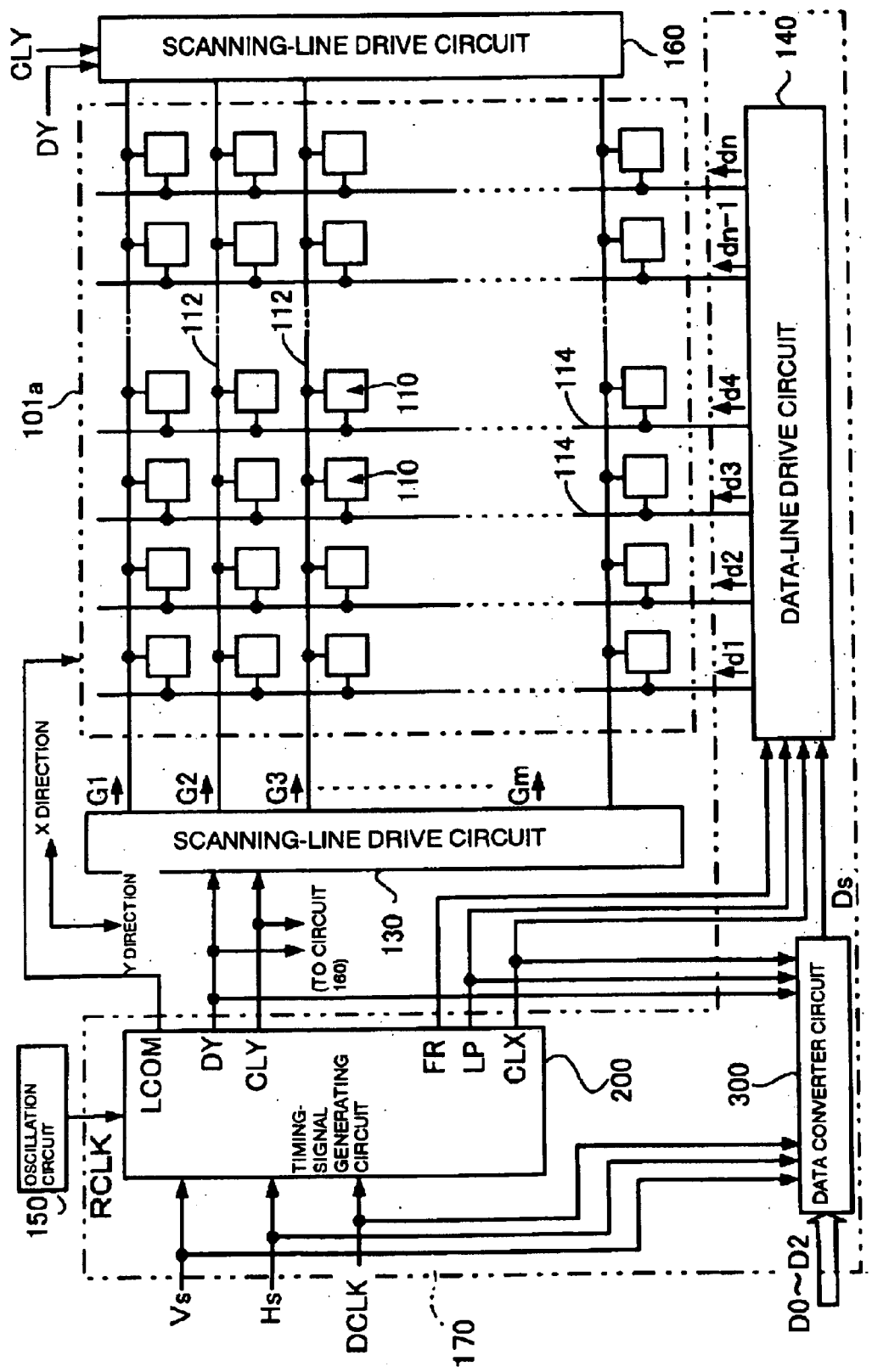
FIG. 1 is a block diagram showing the electrical structure of an electro-optical device according to an embodiment of the present invention.

With reference to FIG. 1, the structure of an electro-optical device according to an embodiment of the present invention will now be described.

In FIG. 1, a high-level device (not shown) supplies a vertical synchronization signal Vs, a horizontal synchronization signal Hs, and dot clock signals DCLK of input gray-scale data D0 to D2 to a timing-signal generating circuit 200. An oscillation circuit 150 supplies a reading timing reference clock RCLK to the timing-signal generating circuit 200. In accordance with these signals, the timing-signal generating circuit 200 generates various timing signals and clock signals, which will be described below. A field reverse signal FR is a signal whose polarity is inverted every frame.

A drive signal LCOM is a signal supplied to a counter electrode on an opposing substrate. In this embodiment, the drive signal LCOM is at a constant potential (zero potential). A start pulse DY is a pulse signal output at the beginning of each frame. A clock signal CLY is a signal defining a horizontal scanning interval of a scanning side (Y side). A latch pulse LP is a pulse signal output at the beginning of the horizontal scanning interval. The latch pulse LP is output when the level of the clock signal CLY changes (that is, rising edge and falling edge). A clock signal CLX is a dot clock signal for display.

In a display region 101a on an element substrate 101, a plurality of scanning lines 112 are formed extending in the X (row) direction. Also, a plurality of data lines 114 are formed extending in the Y (column) direction. Pixels 110 are formed corresponding to intersections of the scanning lines 112 and the data lines 114, and the pixels 110 are aligned in the form of a matrix. In order to simplify the description, the total number of scanning lines 112 is represented as m, and the total number of data lines 114 is n (where m and n are integers of 2 or more), and the electro-optical device is described as an m×n matrix display device.

A scanning-line drive circuit 130 transfers the start pulse DY supplied at the beginning of a frame in accordance with the clock signal CLY and sequentially and exclusively supplies the start pulse DY to first ends of the scanning lines 112 as scanning signals G1, G2, G3, . . . , Gm. A scanning-line drive circuit 160 is structured similarly to the scanning-line drive circuit 130. In accordance with the same timing as the scanning-line drive circuit 130, the scanning-line drive circuit 160 sequentially and exclusively supplies the scanning signals G1, G2, G3, . . . , Gm to second ends of the scanning lines 112. The scanning signals are supplied from both the scanning-line drive circuits 130 and 160 in order to suppress a voltage drop on the scanning lines 112 and to stabilize the operation.

A data converter circuit 300 converts the input gray-scale data D0 to D2, which is input in synchronization with the dot clock signal DCLK, into a data signal Ds which is an analog signal in synchronization with the clock signal CLX and outputs the data signal Ds. The level of the data signal Ds is proportional to the gray-scale data D0 to D2. The level of the data signal Ds is set so that the data signal Ds is at voltage V1 in full-scale (when the gray-scale data DO to D2 is "111").

A data-line drive circuit 140 sequentially samples and holds n data signals Ds, n corresponding to the number of data lines 114 in a horizontal scanning interval, and simultaneously supplies the sampled-held n data signals Ds in the subsequent horizontal scanning interval through a buffer circuit to the corresponding data lines 114 as data signals d1, d2, d3, . . . dn.

1.2 Structure of Electro-optical Device

The structure of the above-described electro-optical device will now be described with reference to FIGS. 2(a) and (b). FIG. 2(a) is a plan view showing the structure of an electro-optical device 100. FIG. 2(b) is a sectional view taken along the line A—A' of FIG. 2(a). As shown in these drawings, the electro-optical device 100 has a structure formed by bonding together, with a predetermined gap therebetween, the element substrate 101 having pixel electrodes 118 and an opposing substrate 102 having a counter electrode 108 by a sealing member 104. The element substrate 101 and the opposing substrate 102 hold therebetween liquid crystal 105 as an electro-optical material.

In fact, the sealing member 104 has a notch. After sealing in the liquid crystal 105 through the notch, the notch is sealed by sealant. However, the notch and the sealant are not shown FIGS. 2(a) and 2(b). The element substrate 101 and the opposing substrate 102 are amorphous substrates made of glass or quartz. The pixel electrodes 118 are formed by TFTs which are formed by depositing low-temperature polysilicon on the element substrate 101. In other words, the electro-optical device 100 is used as a transmissive type device.

At the back of the element substrate 101, a film capacitor sheet 400 is provided in an outside region of the display region 101a. In a region outside the display region 101a and inside the sealing member 104, as in pixel transistors 116, the scanning-line drive circuits 130 and 160 are formed by thin-film transistors on the substrate in rectangular regions 130*a* and 160*a* along a left-hand side 101*b* and a right-hand side 101*c*, respectively, as shown in FIG. 2(*a*). The film capacitor sheet 400 also functions as a light-blocking film for the scanning-line drive circuits 130 and 160 and prevents light from entering the drive circuits formed in this region.

Compared with the other sides, a lower side 101*d* of the element substrate 101 is farther distant from the display region 101*a*. Between the sealing member 104 and the lower side 101*d*, an integrated circuit 170, which is an IC chip, is mounted by COP (chip on glass) or TAB (Tape Automated Bonding). A substantially U-shaped terminal region 107 is formed in a protruding portion of the element substrate 101. The protruding portion protruding above the opposing substrate 102.

A plurality of connection terminals are provided in the terminal region 107. External control signals and power are input through a flexible tape cable 180. A connection terminal of the film capacitor sheet 400 is also connected to the terminal region 107. The structure will be described later.

In contrast, the counter electrode 108 on the opposing substrate 102 conducts electricity to a connection terminal on the element substrate 101 by a conductive member (not shown) which is provided in at least one corner of four corners at which the counter electrode 108 is bonded to the opposing substrate 102. Specifically, the drive signal LCOM is supplied to the opposing electrode 108 through the connection terminal provided on the element substrate 101 and the conductive member.

The integrated circuit 170 is formed by forming the data-line drive circuit 140, the oscillation circuit 150, the timing-signal generating circuit 200, and the data converter circuit 300 on a chip, which is mainly formed of single-crystal silicon, and the chip is sealed with resin. As described with reference to FIG. 1, the timing-signal generating circuit 200 supplies the start pulse DY and the clock signal CLY to the scanning-line drive circuits 130 and 160. These signals are transferred through L-shaped patterns 171 and 172, which protrude to the left and to the right from the integrated circuit 170 toward the regions 130*a* and 160*a*, respectively. As in normal digital integrated circuits, the circuits in the integrated circuit 170 can be operated by a low power supply voltage of approximately 3 V. Thus, the power consumption of the timing-signal generating circuit 200 and the data-line drive circuit 140 can be suppressed.

In accordance with the usage of the electro-optical device 100, for example, when the electro-optical device 100 is a direct-viewing-type device, first, color filters which are aligned in stripes or in the form of a mosaic or a triangle are provided on the opposing substrate 102. Second, for example, a light-blocking film (black matrix) made of metal material or resin is formed on the opposing substrate 102. For example, when the electro-optical device 100 is a direct-viewing-type device, a front light unit for irradiating the electro-optical device 100 with light from the opposing substrate 102 side or a backlight unit to irradiate the electro-optical device 100 with light from the element substrate 101 side is provided if necessary. On electrode-forming surfaces of the element substrate 101 and the opposing substrate 102, alignment films (not shown) which are rubbed in predetermined directions are formed, respectively, defining alignment directions of liquid crystal molecules in a no-voltage-applied state. In contrast, at the opposing substrate 102 side, a polarizer (not shown) in accordance with the alignment direction is formed. If polymer dispersed liquid crystal in which the liquid crystal is dispersed as microparticles in a polymer is used as the liquid crystal 105, the above-described alignment films and the polarizer become unnecessary. As a result, the efficiency in light utilization is increased. It is therefore advantageous in increasing luminance and reducing power consumption.

1.3 Structure of Film Capacitor Sheet 400

Figure 3A:
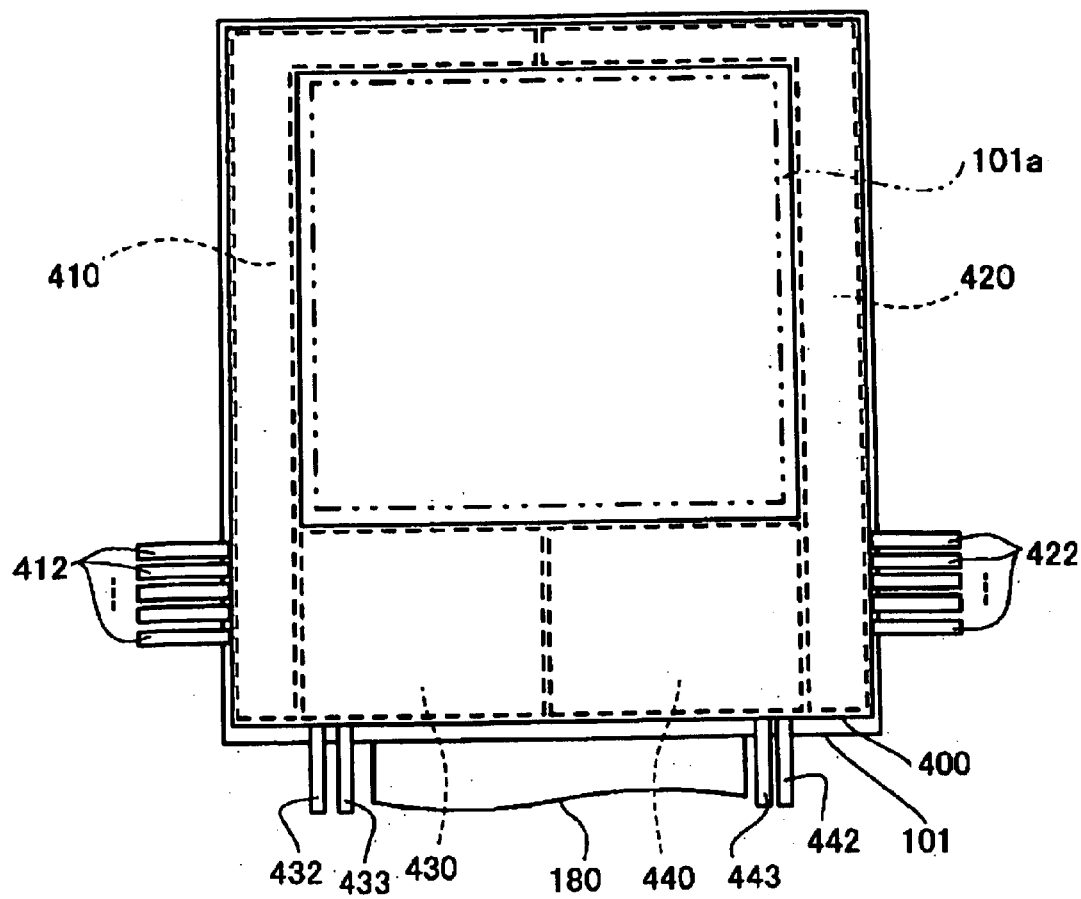
FIGS. 3(a)–3(c) include illustrations showing details of a film capacitor sheet 400 in this embodiment.
Figures 3B, 3C:
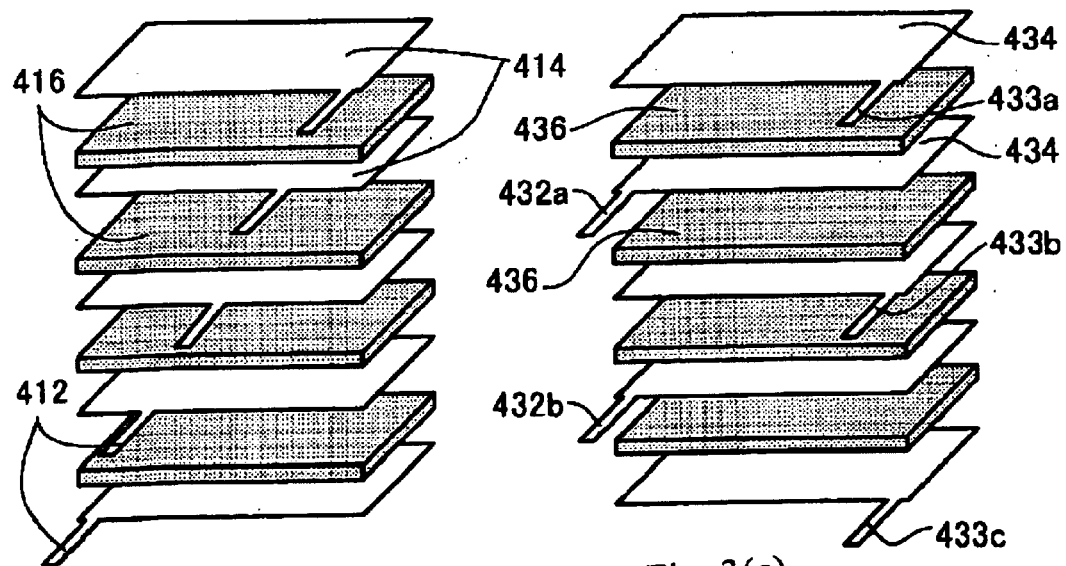

With reference to FIGS. 3(*a*) to (*c*), the structure of the film capacitor sheet 400 will now be described. FIG. 3(*a*) is a back view of the electro-optical device 100, showing a state wherein the film capacitor sheet 400 is being mounted. In FIG. 3(*a*), the film capacitor sheet 400 has substantially the same dimensions as the element substrate 101, except for a hollow portion corresponding to the display region 101*a*. In other words, the film capacitor sheet 400 has a hollow rectangular shape. As shown in FIG. 3(*a*), the film capacitor sheet 400 is fixed to the reverse side of the element substrate 101 with an adhesive or the like.

According to the foregoing mounting method, the film capacitor sheet 400 also functions as a light-blocking film for preventing the scanning-line drive circuits 130 and 160 from being irradiated with light by a backlight unit. Also, the film capacitor sheet 400 is designed to cover not only the rectangular regions 130*a* and 160*a*, in which the circuits are formed, but also the entire region other than the display region 101*a*. Thus, the film capacitor sheet 400 can function as a so-called "partition", which prevents light from being view in a portion other than the display region 101*a*.

The interior of the film capacitor sheet 400 is divided into a plurality of film capacitors 410, 420, 430, and 440. The film capacitors 410 and 420 are L-shaped, and the film capacitors 430 and 440 are rectangular. Lead wires 412, 422, 432, 433, 442, and 443 protrude externally from the film capacitors. These lead wires are bent toward the surface of the element substrate 101 (FIG. 2(*a*)) and are connected to corresponding terminals in the terminal region 107. Accordingly, the corresponding lead wires are connected to circuits of parts in the integrated circuit 170 through the patterns on the element substrate 101.

With reference to FIG. 3(*b*), the structure of the film capacitor 410 will now be described. FIG. 3(*b*) shows five flexible conductor plates 414 which have protrusions. Between these five conductor plates, four dielectric films 16 are held one by one. The protrusions of the conductor plates 414 are the lead wires 412. The positions at which the lead wires 412 are formed are slightly shifted in the horizontal direction. Accordingly, when the film capacitor sheet 400 is formed by stacking the conductor plates 414 and the dielectric films 416, as shown in FIG. 3(*a*), the lead wires 412 protrude as separate lead wires from the film capacitor sheet 400.

The film capacitor 410 is equivalent to a circuit having four capacitors connected in series. The lead wires 412 are provided at both ends of the series circuit and at positions at which the capacitors are connected. With this arrangement, four capacitors can be formed, and hence effective use of the surface area of the conductor plates 414 can be made. The film capacitor 420 is arranged similarly to the film capacitor 410.

With reference to FIG. 3(*c*), the structure of the film capacitor 430 will now be described. FIG. 3(*c*) shows five conductor plates 434 with protrusions. Between these five conductor plates, four dielectric films 436 are held one by one as dielectric. Of the conductor plates 434, protrusions 433*a*, 433*b*, and 433*c* of the first, third, and fifth conductor plates from the top protrude at a common position. These protrusions are connected to form the lead wire 433. Similarly, of the conductor plates 434, protrusions 432*a* and 432*b* of the second and fourth conductor plates from the top provide at a common position. These protrusions are connected to form the lead wire 432.

Accordingly, as shown in FIG. 3(*a*), the two lead wires 432 and 433 protrude from the film capacitor 430. The film capacitor 430 is a capacitor having a multi-layer structure. The potential of the film capacitor 430 can be independent of the other capacitors. Thus, the film capacitor 430 can be used as a pumping capacitor for use in a charge-pumping boosting circuit (power supply circuit, etc.).

After the film capacitors 410, 420, 430, and 440 of types shown in FIGS. 3(*b*) and 3(*c*) are formed in accordance with the purpose and desired capacitance, all of the film capacitors 410, 420, 430, and 440 excluding the lead wire portions are covered with a common film, thereby forming the film capacitor sheet 400. The number of conductor plates 414, the number of dielectric films 416 deposited in one region, the surface area of these conductor plates 414, the surface area of these dielectric films 416, the type of dielectric film, and the thickness of the dielectric film are determined in accordance with a desired capacitance and a desired breakdown voltage of each film capacitor.

An example of a method for forming the dielectric films 436 will now be described. A known barium titanate workpiece is fired, and the fired workpiece is ground to powder. The powder is mixed with a binder of a polymeric material, such as polyethylene or resist. The mixture is formed into a thin sheet with a thickness of approximately tens of $\mu$m, thereby producing the dielectric film 436. In view of the structure of a capacitor, the dielectric coefficient of a normal film capacitor is too low. Because ceramics, such as barium titanate used in the ceramic capacitor, are too hard, it is difficult to mount the ceramic capacitor directly onto the liquid crystal panel.

In contrast, according to the film capacitor sheet 400 of this embodiment, barium titanate powder is mixed with a flexible material; the mixture is formed into a film; and the film is used as a dielectric. It is thus possible to ensure a high dielectric coefficient. Since the film capacitor sheet 400 can be formed into a flexible film, the film capacitor sheet 400 can freely adapt to flexure of a portion at which the film capacitor sheet 400 is mounted and to deformation, such as torsion. Thus, disengagement due to metal fatigue can be reduced or prevented. Also, shock resistance is high. Of course, this embodiment is applicable to the case of using dielectric material other than the barium titanate.

2. Specific Examples of Electronic Apparatuses 2.1 Projector

A few examples in which the above-described film capacitor sheet 400 or the electro-optical device is used in a specific electronic apparatus will now be described.

A projector 5400, which is a projection display using the electro-optical device according to the foregoing embodiment as a light valve, will now be described.

FIG. 4(*a*) is a schematic diagram showing main portions of the projection display. In FIG. 4(*a*), numeral 5431 denotes a light source; numerals 5442 and 5444 denote dichroic mirrors; numerals 5443, 5448, and 5449 denote reflecting mirrors; numeral 5445 denotes an incident lens; numeral 5446 denotes a relay lens; numeral 5447 denotes an outgoing lens; numerals 100R, 100G, and 100B denote liquid crystal optical modulators, which are electro-optical devices having the film capacitor sheet 400; numeral 5451 denotes a cross dichroic prism; and numeral 5437 denotes a projection lens. The light source 5431 is formed by a lamp 5440, which is a metal halide lamp or the like, and a reflector 5441 to reflect light of the lamp. Of a light beam from the light source 5431, the dichroic mirror 5442 to reflecting blue light and green light transmits a red light ray and reflects a blue light ray and a green light ray. The transmitted red light ray is reflected by the reflecting mirror 5443 and enters the red-light liquid crystal optical modulator 100R. Of the colored light rays reflected by the dichroic mirror 5442, the green light ray is reflected by the dichroic mirror 5444 to reflect green light and enters the green-light liquid crystal optical modulator 100G.

In contrast, the blue light ray is transmitted through the second dichroic mirror 5444. For the blue light ray, in order to reduce or prevent optical loss caused by a long optical path, a light leading means formed by a relay lens system including the incident lens 5445, the relay lens 5446, and the outgoing lens 5447 is provided. The blue light ray enters the blue-light liquid crystal optical modulator 100B through the light leading device. The three colored light rays modulated by the optical modulators enter the cross dichroic prism 5451. The prism is formed by bonding four rectangular prisms. The interior is formed by arranging a dielectric multi-layer film for reflecting red light and a dielectric multi-layer film to reflect blue right in the form of a cross. By these dielectric multi-layer films, the three light rays are combined to form light representing a color image. The synthetic light is projected by the projection lens 5437, which is a projection optical system, onto a screen 5452. As a result, the image is enlarged and displayed. Also, the film capacitor sheet 400 is more efficient to shut out a strong light inside the projection display. Moreover, the film capacitor sheet 400 which locates near the substrate has good performance for the purpose of backup of the power source.

2.2 Mobile Computer

An example in which the above-described film capacitor sheet 400 and the electro-optical device are applied to a mobile personal computer will now be described. FIG. 4(*b*) is an elevational view showing the structure of a personal computer. In FIG. 4(*b*), a mobile computer 5200 includes a main unit 5204 with a keyboard 5202 and a display unit 5206. The display unit 5206 is formed by adding a backlight unit at the back of the foregoing electro-optical device 100. The film capacitor sheet 400 is attached on the reverse side of the backlight unit. Using the film capacitor sheet 400 enables the mobile personal computer to have a thinner structure.

2.3 Cellular Phone

An example in which the above-described electro-optical device is applied to a cellular phone is described. FIG. 4(*c*) is a perspective view showing the structure of the cellular phone. In the drawing, a cellular phone 5300 includes a plurality of operation buttons 5302, a mouthpiece 5304, an earpiece 5306, and the electro-optical device 100. A backlight unit is provided at the back of the electro-optical device 100. The film capacitor sheet 400 is attached on the reverse side of the backlight unit. Using the film capacitor sheet 400 which has high shock resistance which enables the cellular phone to also have high shock resistance.

2.4 Others

Examples of electronic apparatuses, in addition to the above-described electronic apparatuses, include a liquid crystal television, a viewfinder videocassette recorder, a monitor-direct-view videocassette recorder, a car navigation apparatus, a pager, an electronic notebook, a calculator, a word processor, a workstation, a video phone, a POS terminal, and an apparatus provided with a touch panel, for example. Needless to say, the foregoing electro-optical device or the film capacitor sheet 400 is applicable to these and other various electronic apparatuses.

3. Modifications

The present invention is not limited to the foregoing embodiment. For example, various modifications can be made. Examples of these modifications are described below.

(1) In the foregoing embodiment, an example of an electro-optical device in which the present invention is applied to a subfield driving liquid crystal panel has been described. However, the present invention is applicable to other passive liquid crystal panels. Further, the present invention is applicable to all other electro-optical devices.

Examples of electro-optical devices include an electroluminescence device and a plasma display.

(2) In the foregoing embodiment, an example in which the film capacitor sheet 400 is fixed to the reverse side of the element substrate 101 has been described. Instead of this structure (or in addition to this structure), the film capacitor sheet 400 can be fixed to other portions of the electro-optical device. For example, as shown in FIG. 5(*a*), the film capacitor sheet 400 can be arranged in the form of a rectangle having a width equivalent to that of the flexible tape wire 180, and this film capacitor film 400 can be attached to the flexible tape wire 180. Because the film capacitor sheet 400 is flexible, the film capacitor sheet 400 can adapt to the flexure of the flexible tape wire 180.

In FIG. 5(*a*), the film capacitor sheet 400 is attached to the flexible tape wire 180. Subsequently, lead wires 452, . . . , 452 are bent toward the reverse side of the flexible tape wire 180. On the reverse side of the flexible tape wire 180, a pattern is partially exposed. The lead wires 452, . . . , 452 are bonded to the exposed pattern. Alternatively, the film capacitor sheet 400 may be formed to be integrated with the flexible tape wire 180. As shown in FIG. 5(*b*), the film capacitor sheet 400 can be mounted on a hard wiring board (PWB) or flexible substrate (FPC) 190. Although not shown in FIG. 5(*b*), when the hard wiring board (PWB) or the flexible substrate (FPC) 190 is a multi-layer substrate, the film capacitor sheet 400 can be included as one layer in the multi-layer substrate.

(3) The film capacitor sheet 400 in the foregoing embodiment can be embedded in a composite build-up substrate. The composite build-up substrate is manufactured by a method of stacking new layers, which are referred to as build-up layers, above and below a core layer (multi-layer substrate to be a core) of a printed wiring board. The multi-layer build-up substrate is frequently used in cellular phones and personal digital assistants. The film capacitor sheet 400 can be applied to one build-up layer.

(4) In the foregoing embodiment, when the backlight unit is provided at the back of the element substrate 101, the film capacitor sheet 400 can be attached to the reverse side of the backlight unit. The backlight unit is manufactured in the form of a rectangle having dimensions equivalent to, for example, those of the display region 101*a*. The backlight unit, which is provided on the reverse side of the element substrate 101, is fixed so as to cover the display region 101*a*. Since the reverse side of the backlight unit has a relatively large area equivalent to that of the display region 101*a*, the total capacitance realized by the film capacitor sheet 400 can be increased.

As described above, according to the present invention, one or a plurality of capacitors is provided in a capacitor sheet which is a flexible sheet. Accordingly, the capacitor can be mounted stably despite flexure of an electro-optical device or shock applied to the electro-optical device. In the structure in which the capacitor sheet is mounted in the periphery of a display region or a drive circuit region is shielded from irradiation light, a light-blocking effect in a non-display region of the electro-optical device can be enhanced.

What is claimed is:

1. A capacitor sheet comprising:
 a plurality of independent capacitor sheet sections arranged into a desired shape, each capacitor sheet section including:
  a dielectric layer which is a flexible sheet formed by mixing dielectric material powder with a polymeric material; and
  conductor layers which are flexible and which are formed so as to hold the dielectric layer therebetween.

2. The capacitor sheet according to claim 1, the capacitor sheet being formed by a plurality of capacitors formed in each region on a surface of the sheet.

3. A flexible substrate, comprising:
 the capacitor sheet as set forth in claim 1, the capacitor sheet being one of mounted on a top surface of the flexible substrate and included as a layer in the flexible substrate.

4. A composite build-up substrate, comprising:
 the capacitor sheet as set forth in claim 1, the capacitor sheet being one of mounted on a top surface of the composite build-up substrate and included as a layer in the composite build-up substrate.

5. An electronic apparatus, comprising:
 the capacitor sheet as set forth in claim 1.

6. The capacitor sheet according to claim 1, wherein the independent capacitor sheet sections include at least three capacitor sheet sections arranged to form different sides of a frame shape as the desired shape.

7. The capacitor sheet according to claim 1, wherein each conductor layer includes a protrusion serving as a lead wire, protrusions of each capacitor sheet section being clustered at a predetermined connecting position.

8. An electro-optical device with a capacitor, comprising:
 a plurality of scanning lines;
 a plurality of data lines; and
 pixels which are arranged in correspondence with intersections of the data lines and the scanning lines and which define a display region; and
 a capacitor sheet at the periphery of the display region and including:
  a dielectric layer formed from a dielectric material dispersed in a polymeric material; and
  conductor layers sandwiching the dielectric layer therebetween.

9. The electro-optical device with a capacitor according to claim 8, the capacitor sheet having shock resistance.

10. The electro-optical device as claimed in claim 8, further comprising a drive circuit electrically connected to at least one of the conductor layers of the capacitor sheet.

11. The electro-optical device as claimed in claim 8, wherein the capacitor sheet includes a light-blocking material and serves as a light shield.

12. An electro-optical device with a capacitor, comprising:
 a plurality of scanning lines;
 a plurality of data lines;

pixels which are arranged in correspondence with intersections of the data lines and the scanning lines; and a capacitor sheet fixed to the electro-optical device and forming a capacitor which has one of a single-layer and a multi-layer structure, the capacitor including:

a dielectric layer which is a flexible sheet formed by mixing dielectric material powder with a polymeric material; and conductor layers which are flexible and which are formed so as to hold the dielectric layer therebetween, the electro-optical device having a display region to display information by being irradiated with external irradiation light; and the capacitor sheet being mounted along the periphery of the display region, whereby a portion in which the capacitor sheet is mounted is shielded from the irradiation light.

13. A capacitor sheet forming a capacitor which has one of a single-layer and a multi-layer structure, the capacitor comprising:

a dielectric layer which is a flexible sheet formed by mixing barium titanate powder with a polymeric material; and conductor layer which are flexible and which are formed so as to hold the dielectric layer therebetween.

* * * * *